United States Patent [19]

Bayraktaroglu

[11] Patent Number: 5,725,786
[45] Date of Patent: Mar. 10, 1998

[54] DURABLE MASK AND METHOD OF FABRICATION

[76] Inventor: Burhan Bayraktaroglu, 409 Buckspur Ct., Millersville, Md. 21108

[21] Appl. No.: 560,184

[22] Filed: Nov. 20, 1995

[51] Int. Cl.$^6$ .................................................. G03F 9/00
[52] U.S. Cl. ............................. 216/12; 216/49; 216/51; 378/35; 430/5
[58] Field of Search .................... 216/12, 43, 49, 216/51; 378/35

[56] References Cited

U.S. PATENT DOCUMENTS

| | | | |
|---|---|---|---|
| 4,859,633 | 8/1989 | Bayraktaroglu | 437/211 |
| 5,171,713 | 12/1992 | Matthews | 437/189 |
| 5,382,315 | 1/1995 | Kumar | 156/643 |
| 5,567,551 | 10/1996 | Yahalom et al. | 430/5 |

Primary Examiner—R. Bruce Breneman
Assistant Examiner—Michael E. Adjodha
Attorney, Agent, or Firm—Walter G. Sutcliff

[57] ABSTRACT

The durable mask includes a polyimide layer formed over a portion of a semiconductor substrate to be masked. A heavy metal layer is then formed over the polyimide layer. An adhesion layer is formed between the polyimide layer and the heavy metal layer to insure adhesion of the heavy metal layer to the polyimide layer. The durable mask may mask, for example, a heterojunction bipolar transistor formed in the semiconductor substrate prior to an ion implantation process. Furthermore, the mask is removed from the substrate by eliminating the adhesion between the mask and substrate or by dissolving the polyimide layer.

13 Claims, 3 Drawing Sheets

DURABLE MASK AND METHOD OF FABRICATION

BACKGROUND OF THE INVENTION

The present invention relates to a durable mask and method of fabrication; and particularly, to fabricating a durable mask and a durable mask suitable for GaAs devices which masks high energies while maintaining good line definition.

Ion implantation is an intrinsic part of the modern semiconductor processing technology. It is used to modify the conductivity of layers at or close to the surface of the wafer. The fabrication of buried layers and those requiring SOI capabilities rely on very high energy and very high ion dose implantations.

In the III-V compound semiconductor technology, such as in GaAs, ion implantation is also used to convert the epitaxial layers into semi-insulating by ion implant damage. This process requires high energies and high ion doses. Vertically oriented devices such as heterojunction bipolar transistors can only be isolated with very energetic ions. For example, an X/Ku-band power HBT requires 5 MeV oxygen implantation to effectively convert all layers into semi-insulating. The requirement for an S/C-band device may be twice as high. A good ion implantation mask (1) must stop all ions (either the mask must be thick or it must be made of a high density material); (2) must not degrade during the implantation process; (3) must have good line definition; and (4) removal after implantation should not degrade surface quality.

The conventional method of masking is to use thick, hardened, photoresist layers. Although photoresist is not a high density material, it can be fabricated easily by photolithography. To withstand the implantation process, however, especially when it involves high energy and high dose ions, it is hardened by baking at elevated temperatures. Hardened photoresist is denser and produces less outgassing during implantation. But the process of hardening changes the mask edge slope so that the line definition is degraded. If very high energy doses are used, even a hardened photoresist can be difficult to remove from the wafer.

SUMMARY OF THE INVENTION

An objective of the present invention is to provide a durable mask and method of fabrication.

A further objective of the present invention is to provide a durable mask and method of fabrication which masks high energies while maintaining good line definition.

An additional objective of the present invention is to provide a durable mask and method of fabrication which allows for easy damage free removal of the durable mask.

A further objective of the present invention is to provide a durable mask and method of fabrication which is compatible with standard fabrication and processing techniques.

These and other objectives are achieved by forming a thin polyimide layer over portions of a semiconductor device to be masked, and forming heavy metal patterns such as gold over the thin polyimide layer. Due to the nature of polyimide, adhesion of masking material thereto may be difficult. Accordingly, an adhesion layer such as titanium is provided between the polyimide and heavy metal layer.

Other objectives, features, and characteristics of the present invention; methods, operation, and functions of the related elements of the structure; combination of parts; and economies of manufacture will become apparent from the following detailed description of the preferred embodiments and accompanying drawings, all of which form a part of this specification, wherein like reference numerals designate corresponding parts in the various figures.

DETAILED DESCRIPTION OF THE PREFERRED EMBODIMENTS

Figure 1A:
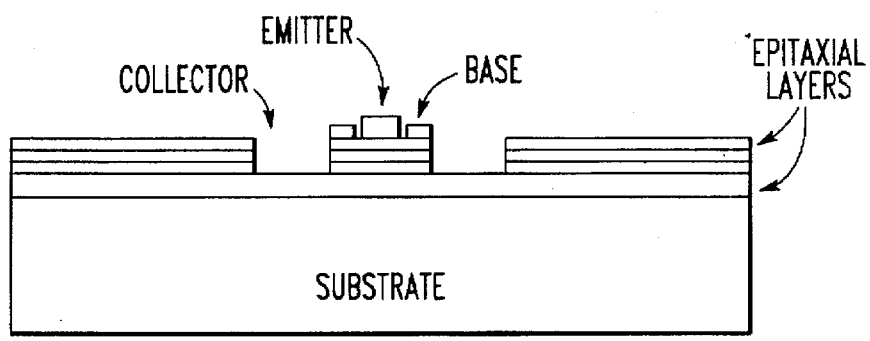
FIGS. 1(a)–1(h) illustrate the method of fabricating the durable mask.

The method of fabricating the durable mask will be described with respect to FIGS. 1(a)–1(h). While FIG. 1(a) illustrates a typical microwave power HBT on a GaAs substrate, the durable mask may be fabricated to cover any semiconductor device or portions thereof. Additionally, the durable mask is not limited to semiconductor device formed or being formed in GaAs. The durable mask may be used with any III-V or silicon based semiconductor compound.

Figure 1B:
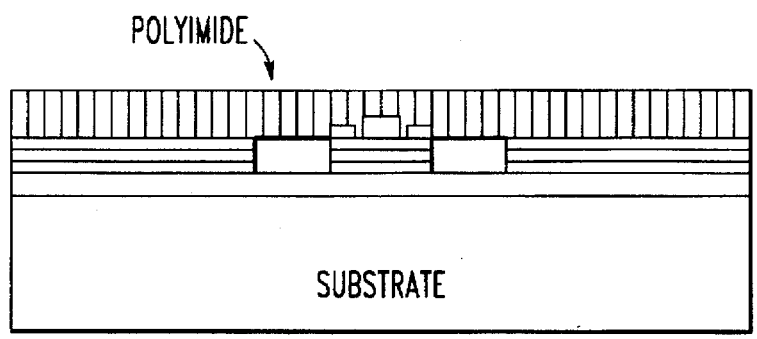

As illustrated in FIG. 1(b), a thin polyimide layer is spun on the wafer and partially cured. Since the spin coating technique is well known in the art it will not be described in detail. As is also well known, curing polyimide normally requires heating the wafer with the polyimide layer at ~400° C. for about one hour. This, however, forms a polyimide layer which can not be removed from the wafer without greatly damaging the wafer.

The polyimide layer in the present invention, however, is only partially cured by heating the wafer with the polyimide layer to ~200° C. for about 5 minutes. For example, for DuPont PI2555 polyimides, partial curing is achieved using a cure temperature of 200° C. for 5–10 minutes. Partially curing the polyimide layer in this manner allows relatively easy removal of the polyimide layer, but sufficiently hardens the polyimide layer to withstand the deposition and lift off of photoresist in the later fabrication steps. Optionally, to effect a different removal process discussed in detail below, the polyimide layer is cured at 150° C. for 5–10 minutes.

A trade off exists with respect to the thickness of the polyimide layer. The thicker the polyimide layer, the easier the polyimide layer is to remove. The thinner the polyimide layer, the greater the resolution of the resulting mask. Preferably, the polyimide layer should be formed between 0.5–3 µm. In a preferred embodiment, a polyimide thickness of 1 µm is preferred. Additionally, a type III polyimide is preferred since such polyimides provide chemical inertness. Instead of a polyimide, other high temperature organic layers may also be used.

Next, optical-lithography or other well known lithographic techniques are used to define the mask areas in photoresist. Since such techniques are so well known they will not be described in detail.

Figure 1C:
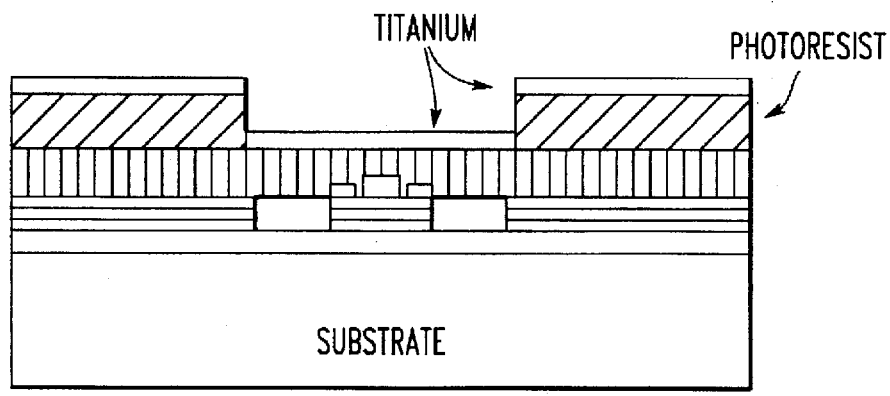

A thin layer of titanium is then deposited on the wafer as shown in FIG. 1(c) using election beam evaporation. Since depositing metals using election beam evaporation is so well-known, this technique will not be described in detail. Evaporation, however, is also possible from heated tungsten crucibles. The titanium layer is preferably formed about 300–1000 Å thick; where Å stands for Angstroms. In a preferred embodiment, the titanium layer is formed 500 Å thick.

Unlike most elements, the titanium adheres to the polyimide and provides a foundation on which to form the principle mask material. Accordingly, other elements or compounds, such as chromium (Cr), Molybdenum (Mo), and aluminum (Al) which adhere to polyimide may be used in place of titanium as the adhesion layer.

Figure 1D:
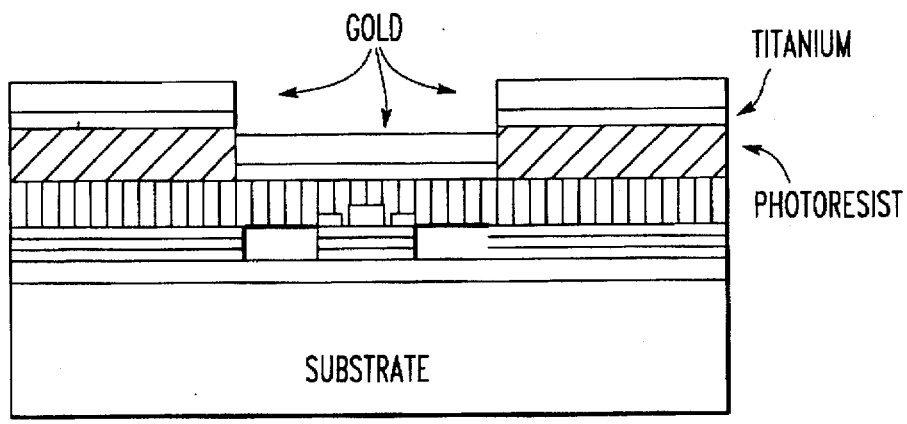

Using the same election beam evaporation technique, a thick layer of gold is deposited on the titanium layer as shown in FIG. 1(d). The gold layer is preferably formed 1 to 5 μm thick depending on the application. The more durable a mask required for a given process, the thicker the gold layers are formed, such as for higher energy implantation applications. In a preferred embodiment a gold layer of 3 μm thick is formed.

A layer of gold this thick will provide masking capabilities for ion energies up to the MeV range (e.g., up to 10 MeV for oxygen) while maintaining good line definition. The present invention is not limited to the use of gold as the primary masking layer. Other heavy metals such as platinum and silver, among others, may be used.

Figure 1E:
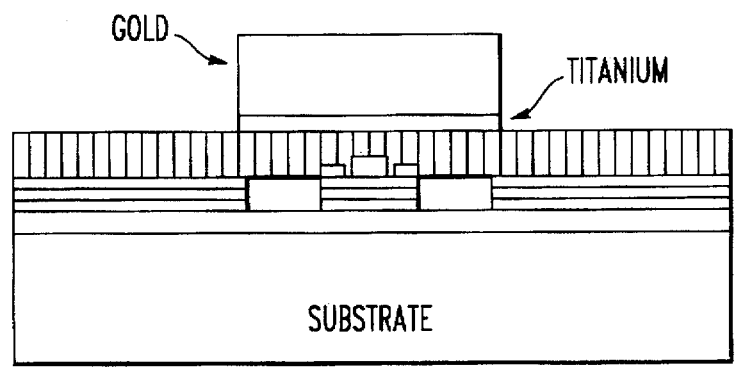

The well known lift-off technique is then used to remove the photoresist, and the titanium and gold layers deposited on the photoresist. A tape lift-off is preferred for this process for simplicity, but other well known techniques for removing photoresist could be used. Since these techniques for removing photoresist are so well known they will not be described in detail. After removal of the photoresist, the wafer looks as illustrated in FIG. 1(e).

Figure 1F:
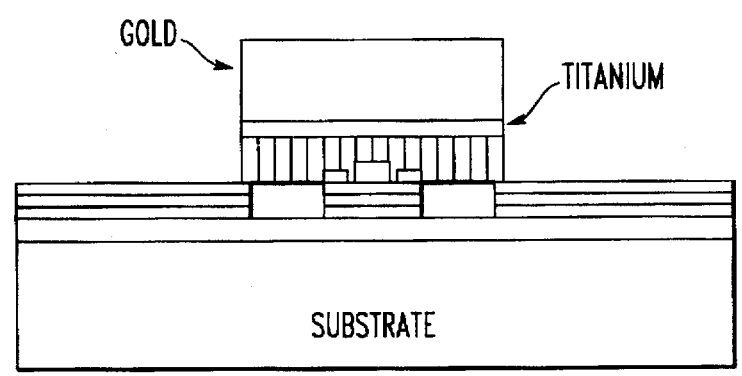

Next, fabrication of the durable mask is completed by removing the exposed polyimide through low pressure oxygen Reactive-Ion Etching (RIE). FIG. 1(f) illustrates the durable mask after RIE. The gold layer protects the polyimide portion underneath such that only the exposed polyimide is etched away.

Since RIE is such a well known technique, it will not be described in detail. Other etching techniques may be used; however, RIE is preferred since undercut of the polyimide underneath the gold layer is minimized. The polyimide underneath the gold layer protects the device during subsequent processing, and provides additional masking during, for example, ion implantation. It is also possible to leave all or part of the exposed polyimide on the wafer surface for protection thereof. Such a layer can also aid in tailoring, for example, the implantation profile.

Figure 1G:
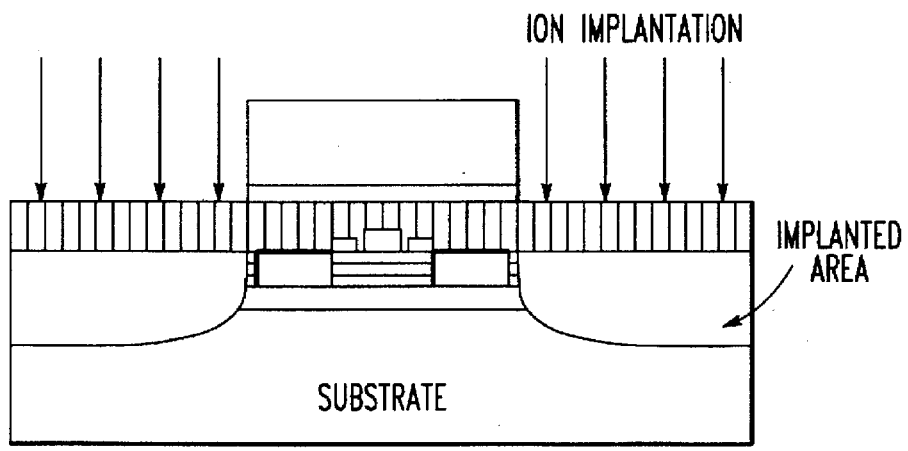

The fabrication process described above was used to form a durable mask over a microwave power HBT on a GaAs wafer such as illustrated in FIG. 1(f). The thickness of the gold layer formed was 3.2 μm. The wafer was then subjected to implantation of multienergy oxygen ions from 0.25 MeV to 5.5 MeV such as illustrated in FIG. 1(g). Compared to the conventional hardened photoresist mask and low energy ion implants, the durable mask of the present invention allowed higher energy ion implantation such that isolation between devices improved by two orders of magnitude. Leakage current measurements were used as the measure of isolation between devices. It should be understood that use of the durable mask and method of fabrication according to the present invention is not limited to the application of ion implantation.

Figure 1H:
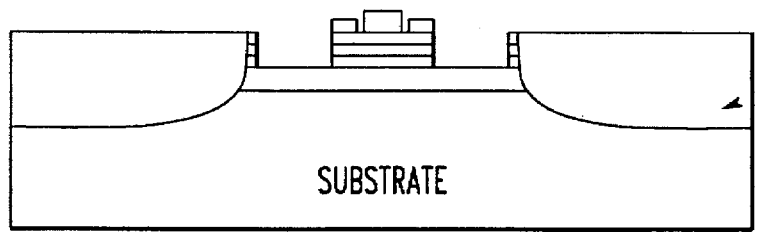

Another advantage of the present invention is the ease with which the durable mask may be removed. After the process for which the mask was needed, the wafer is soaked in ammonium hydroxide, NH$_4$OH, while being ultrasonically agitated. The partially cured polyimide loses its adhesion to the wafer surface and lifts the masking metal (e.g., gold with titanium adhesion layer) in about 5 minutes. The wafer is then rinsed in de-ionized water and dried. When, however, the polyimide is cured at a lower temperature, the 150° C. option discussed above, the durable mask may be removed by dissolving the polyimide layer. To dissolve the polyimide layer, any well known resist stripper may be used; preferably, at an elevated temperature such as 90° C. The resulting wafer with the durable mask removed is illustrated in FIG. 1(h).

As the foregoing evidences, the durable mask of the present invention can be formed using well known processing techniques. The durable mask, however, offers improved masking capabilities; particularly for high ion energies. Furthermore, the durable mask does not decompose under high energy implantation, nor does its edge definition degrade. After processes requiring the durable mask, the durable mask may be easily removed. This mask removal is simpler, and produces clean and less damaged surfaces.

While the invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

I claim:

1. A method of fabricating a durable mask, comprising:
   (a) providing a semiconductor substrate;
   (b) forming a partially cured polyimide layer over said semiconductor substrate;
   (c) forming a heavy metal layer over a portion of said polyimide layer covering a designated portion of said semiconductor substrate, said designated portion of said semiconductor substrate being a portion of said semiconductor substrate to be masked; and
   (d) removing portions of said polyimide layer not covered by said heavy metal layer.

2. The method of claim 1, further comprising:
   after step (b) and before step (c), (e) forming an adhesion layer over said portion of said polyimide layer covering said designated portion of said semiconductor substrate; and wherein
   said step (c) forms said heavy metal layer over said adhesion layer.

3. The method of claim 2, wherein said adhesion layer is a layer of titanium.

4. The method of claim 1, wherein said heavy metal layer is one of gold, platinum, and silver.

5. The method of claim 1, further comprising (e) removing said heavy metal layer and said polyimide layer covering said designated portion of said semiconductor substrate after an operation requiring said durable mask.

6. The method of claim 1, wherein said operation requiring said durable mask is ion implantation.

7. The method of claim 1, wherein said step (b) includes (b1) applying a polyimide layer over said semiconductor substrate and (b2) partially curing said polyimide layer.

8. The method of claim 1, wherein said step (a) provides a semiconductor substrate having a heterojunction bipolar transistor formed thereon.

9. A durable mask, comprising:
   a partially cured polyimide layer formed over a portion of a semiconductor substrate, said portion of said semiconductor substrate being a portion to be masked; and
   a heavy metal layer formed over said polyimide layer.

10. The durable mask of claim 9, further comprising an adhesion layer formed between said polyimide layer and said heavy metal layer so that said heavy metal layer adheres to said polyimide layer.

11. The durable mask of claim 10, wherein said adhesion layer is a layer of titanium.

12. The durable mask of claim 9, wherein said heavy metal layer is one of gold, platinum, and silver.

13. The durable mask of claim 9, wherein said semiconductor substrate has a heterojunction bipolar transistor formed thereon.

* * * * *